(12) United States Patent
Utsumi et al.

(10) Patent No.: US 12,022,673 B2
(45) Date of Patent: Jun. 25, 2024

(54) DISPLAY DEVICE INCLUDING ELECTRON TRANSPORT LAYER HAVING NANOPARTICLE OF METAL OXIDE

(71) Applicant: SHARP KABUSHIKI KAISHA, Sakai (JP)

(72) Inventors: Hisayuki Utsumi, Sakai (JP); Youhei Nakanishi, Sakai (JP); Masayuki Kanehiro, Sakai (JP); Shota Okamoto, Sakai (JP); Hiroki Imabayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 446 days.

(21) Appl. No.: 17/298,847

(22) PCT Filed: Dec. 11, 2018

(86) PCT No.: PCT/JP2018/045427
§ 371 (c)(1),
(2) Date: Jun. 1, 2021

(87) PCT Pub. No.: WO2020/121398
PCT Pub. Date: Jun. 18, 2020

(65) Prior Publication Data
US 2022/0037609 A1    Feb. 3, 2022

(51) Int. Cl.
*H10K 50/16* (2023.01)
*H10K 59/122* (2023.01)
(Continued)

(52) U.S. Cl.
CPC ............. *H10K 50/16* (2023.02); *H10K 59/35* (2023.02); *H10K 71/00* (2023.02); *H10K 59/122* (2023.02);
(Continued)

(58) Field of Classification Search
CPC ........ H10K 50/16; H10K 59/35; H10K 71/00; H10K 59/122; H10K 85/636;
(Continued)

(56) References Cited

U.S. PATENT DOCUMENTS

2006/0240281 A1\* 10/2006 Liao ........................ H10K 50/17
257/E51.047
2015/0280130 A1\* 10/2015 Sago .................... H10K 71/135
438/46
(Continued)

FOREIGN PATENT DOCUMENTS

| JP | 2015-099804 A | | 5/2015 |
| KR | 20130037569 | \* | 4/2013 |
| KR | 101620870 | \* | 5/2016 |

*Primary Examiner* — Duy T Nguyen
(74) *Attorney, Agent, or Firm* — ScienBiziP, P.C.

(57) ABSTRACT

A display device includes an anode electrode a cathode electrode a light-emitting layer, and an electron transport layer. The light-emitting layer is provided between the anode electrode and the cathode electrode. The electron transport layer is provided between the cathode electrode and the light-emitting layer. The electron transport layer includes a nanoparticle of a metal oxide, and an organic modifier configured to cover a surface of the nanoparticle and having electron donating characteristics.

5 Claims, 3 Drawing Sheets

(51) Int. Cl.
  *H10K 59/35*   (2023.01)
  *H10K 71/00*   (2023.01)
  *H10K 85/60*   (2023.01)
  *H10K 102/00*  (2023.01)

(52) U.S. Cl.
  CPC ....... *H10K 85/636* (2023.02); *H10K 85/6572* (2023.02); *H10K 2102/00* (2023.02); *H10K 2102/331* (2023.02)

(58) Field of Classification Search
  CPC ........... H10K 85/6572; H10K 2102/00; H10K 2102/331; H10K 50/115; H10K 85/631; G09F 9/30; H05B 33/12; H05B 33/14
  USPC .......................................................... 257/40
  See application file for complete search history.

(56) References Cited

U.S. PATENT DOCUMENTS

| | | | |
|---|---|---|---|
| 2016/0056219 A1* | 2/2016 | Kim ..................... | H10K 30/865 257/40 |
| 2016/0155784 A1* | 6/2016 | Park ........................ | G03F 7/004 438/23 |
| 2016/0248035 A1* | 8/2016 | Hwang ................ | H10K 59/122 |
| 2019/0288230 A1* | 9/2019 | Kim ..................... | H10K 85/111 |

* cited by examiner

DISPLAY DEVICE INCLUDING ELECTRON TRANSPORT LAYER HAVING NANOPARTICLE OF METAL OXIDE

TECHNICAL FIELD

The disclosure relates to a display device including, between a cathode electrode and a light-emitting layer, an electron transport layer including a nanoparticle of a metal oxide, and a method for manufacturing the display device.

BACKGROUND ART (a) of FIG. 3 is a diagram illustrating a layered structure of main portions of a light-emitting element of a known display device. (b) of FIG. 3 is a diagram schematically illustrating a structure of an electron transport layer on a light-emitting layer of the display device illustrated in (a) of FIG. 3. As illustrated in (a) of FIG. 3, the display device including a quantum dot light emitting diode includes an electron transport layer (hereinafter referred to as an "ETL") 124c between a quantum dot light-emitting layer 124b and a cathode electrode 125. As illustrated in (b) of FIG. 3, the ETL 124c is formed by spin coating (spinner coating) a dispersion in which nanoparticles NP of metal oxide (generally, zinc oxide) are dispersed in a solvent.

CITATION LIST

Patent Literature

PTL 1: JP 2015-099804 A

SUMMARY

Technical Problem

However, since the nanoparticles NP described above are small, the nanoparticles NP are easily agglomerated and have low dispersibility. Thus, when the ETL 124c is formed by spinner coating the dispersion described above, stable deposition cannot be performed, and as illustrated in (b) of FIG. 3, the formed ETL 124c is non-uniform and has poor flatness. As a result, electron transfer in the ETL 124c becomes uneven, and it is highly likely that uniform light emission is not obtained.

Note that, for example, PTL 1 discloses that, in order to improve film adhesion between a transparent resin substrate in an organic electroluminescence element and an inorganic function layer such as an electrode layer, a barrier layer, and a charge injection/transport layer, a metal oxide nanoparticle-containing layer in which nanoparticles of metal oxide subjected to surface treatment by a coupling agent such as a silane coupling agent are dispersed in an active ray-curable resin is formed between the transparent resin substrate described above and the inorganic function layer described above.

According to PTL 1, by performing surface treatment on the nanoparticles of the metal oxide with a coupling agent such as a silane coupling agent, affinity between the nanoparticles of the metal oxide described above and the active ray-curable resin described above can be increased, and the nanoparticles of the metal oxide described above can be uniformly dispersed in the active ray-curable resin described above.

However, the metal oxide nanoparticle-containing layer described in PTL 1 is not an electron transport layer itself. Further, the silane coupling agent is not a dopant, and cannot give or receive electrons. In other words, the silane coupling agent does not have a function of receiving electrons and giving the electrons nanoparticles of metal oxide. Thus, the metal oxide nanoparticle-containing layer described in PTL 1 cannot be used as an electron transport layer.

An aspect of the disclosure has been made in view of the problem described above, and an object of the disclosure is to provide a display device having higher dispersibility of an electron transport layer including nanoparticles of metal oxide than that in the related art and having more excellent luminous efficiency than that in the related art, and a method for manufacturing the display device.

Solution to Problem

In order to solve the problem described above, a display device according to an aspect of the disclosure includes an anode electrode, a cathode electrode, a light-emitting layer provided between the anode electrode and the cathode electrode, and an electron transport layer provided between the cathode electrode and the light-emitting layer, where the electron transport layer includes a nanoparticle of a metal oxide, and an organic modifier configured to cover a surface of the nanoparticle and having electron donating characteristics.

In order to solve the problem described above, a method for manufacturing a display device according to an aspect of the disclosure is a method for manufacturing a display device including an anode electrode, a cathode electrode, a light-emitting layer provided between the anode electrode and the cathode electrode, and an electron transport layer provided between the cathode electrode and the light-emitting layer, the electron transport layer including a nanoparticle of a metal oxide, and an organic modifier configured to cover a surface of the nanoparticle and having electron donating characteristics, and is a method including curing the light-emitting layer, and then layering the electron transport layer on the light-emitting layer.

Advantageous Effects of Disclosure

According to an aspect of the disclosure, a display device having higher dispersibility of an electron transport layer including nanoparticles of metal oxide than that in the related art and having more excellent luminous efficiency than that in the related art, and a method for manufacturing the display device can be provided.

DESCRIPTION OF EMBODIMENTS

One embodiment of the disclosure will be described hereinafter with reference to (a) and (b) of FIG. 1 and FIG. 2.

Display Device

Hereinafter, a case will be given as an example in which a display device according to the present embodiment is a quantum dot light emitting diode (hereinafter referred to as a "QLED") display including a QLED as a light-emitting element.

Figure 1:
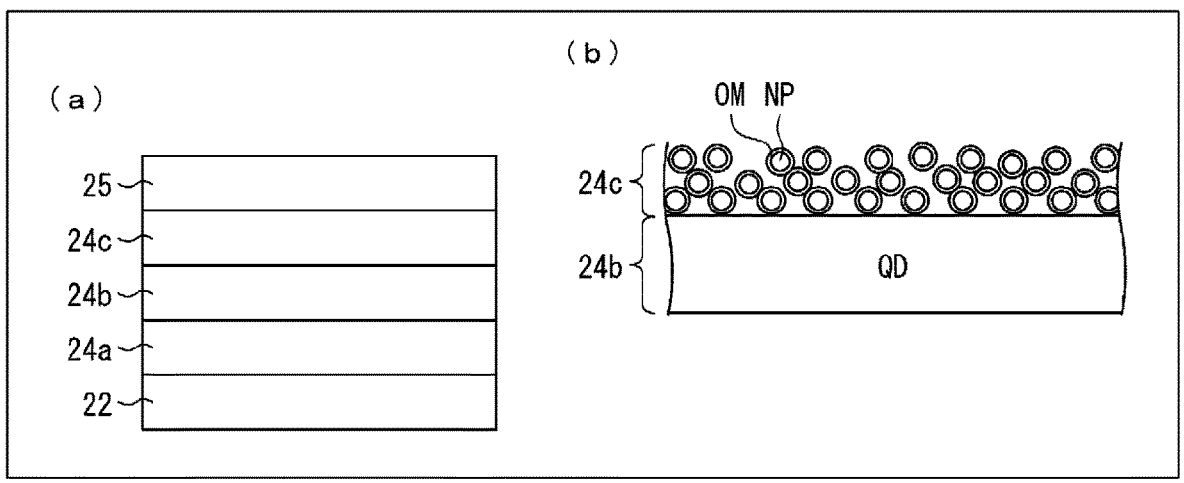
FIG. 1(a) is a diagram schematically illustrating an example of a layered structure of a light-emitting element of a display device according to an embodiment of the disclosure.
FIG. 1(b) is a diagram schematically illustrating a structure of an electron transport layer on a light-emitting layer of the display device illustrated in FIG. 1(a).

(a) of FIG. 1 is a diagram schematically illustrating an example of a layered structure of a QLED in a display device 1 according to the present embodiment. (b) of FIG. 1 is a diagram schematically illustrating a structure of an electron transport layer (hereinafter referred to as an "ETL") 24c on a quantum dot light-emitting layer (hereinafter, referred to as a "QD light-emitting layer") 24b of the display device 1 illustrated in (a) of FIG. 1. FIG. 2 is a cross-sectional view illustrating an example of a schematic configuration of the display device 1 according to the present embodiment including QLEDs 5R, 5G, and 5B as a light-emitting element.

Figure 2:
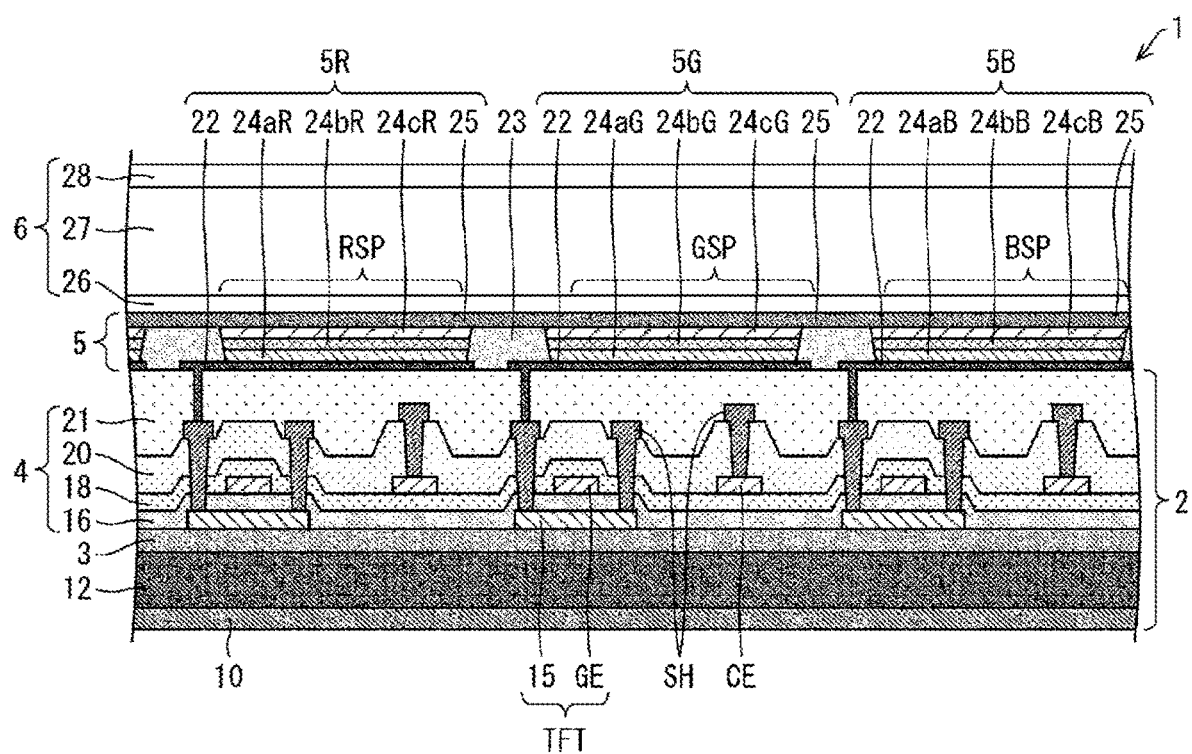
FIG. 2 is a cross-sectional view illustrating an example of a schematic configuration of the display device according to the embodiment of the disclosure.

As illustrated in FIG. 2, the display device 1 according to the present embodiment has a configuration in which a QLED layer 5 is provided as a light-emitting element layer on an array substrate 2. The QLED layer 5 is covered with a sealing layer 6.

The array substrate 2 includes, for example, a lower face film 10, a resin layer 12, a barrier layer 3, and a TFT layer 4 as a drive element layer.

The lower face film 10 is, for example, a polyethylene terephthalate (PET) film bonded to a lower face of the resin layer 12 after a support substrate (for example, a mother glass) is peeled off to achieve a display device with excellent flexibility. Note that a solid substrate such as a glass substrate may be used instead of the lower face film 10 and the resin layer 12. Note that examples of the material of the resin layer 12 include a polyimide and the like. A portion of the resin layer 12 can be replaced by two resin films (for example, polyimide films) with an inorganic insulating film sandwiched therebetween.

The barrier layer 3 is a layer that prevents foreign matters such as water and oxygen from entering the TFT layer 4 and the QLED layer 5.

A subpixel circuit for controlling a light-emitting element is formed in the TFT layer 4. The TFT layer 4 includes a semiconductor film 15, an inorganic insulating film 16 (gate insulating film) in an upper layer than the semiconductor film 15, a gate electrode GE and a gate wiring line in an upper layer than the inorganic insulating film 16, an inorganic insulating film 18 in an upper layer than the gate electrode GE and the gate wiring line, a capacitance electrode CE in an upper layer than the inorganic insulating film 18, an inorganic insulating film 20 in an upper layer than the capacitance electrode CE, a wiring line including a source wiring line SH in an upper layer than the inorganic insulating film 20, and a flattening film 21 (interlayer insulating film) in an upper layer than the source wiring line SH, and a TFT serving as a drive element is formed so as to include the semiconductor film 15 and the gate electrode GE.

The semiconductor film 15 is formed of low-temperature polysilicon (LTPS) or an oxide semiconductor, for example. Note that FIG. 2 illustrates the TFT that has a top gate structure including the semiconductor film 15 as a channel, but the TFT may have a bottom gate structure.

The barrier layer 3 and the inorganic insulating films 16, 18, and 20 may include, for example, a silicon oxide (SiOx) film, a silicon nitride (SiNx) film, a silicon oxynitride film (SiNO), or a layered film of these, formed by chemical vapor deposition (CVD).

The gate electrode GE, the capacitance electrode CE, and the wiring line such as the source wiring line SH are each formed of a single layer film or a layered film of a metal, for example, including at least one of aluminum (Al), tungsten (W), molybdenum (Mo), tantalum (Ta), chromium (Cr), titanium (Ti), and copper (Cu), for example.

The flattening film 21 can be formed of a coatable photosensitive organic material such as a polyimide resin and an acrylic resin, for example.

A plurality of QLEDs are provided as a light-emitting element in the QLED layer 5. The QLED is formed for each subpixel, corresponding to a subpixel.

The display device 1 includes, as a subpixel, a subpixel RSP (red subpixel) that emits red light, a subpixel GSP (green subpixel) that emits green light, and a subpixel BSP (blue subpixel) that emits blue light, for example.

The subpixel RSP is provided with the QLED 5R that emits red light as a QLED. The subpixel GSP is provided with the QLED 5G that emits green light as a QLED. The subpixel BSP is provided with the QLED 5B that emits blue light as a QLED.

Here, the red light refers to light having a light emission central wavelength in a wavelength band longer than 600 nm and shorter than or equal to 780 nm. The green light refers to light having a light emission central wavelength in a wavelength band longer than 500 nm and shorter than or equal to 600 nm. The blue light refers to light having a light emission central wavelength in a wavelength band longer than or equal to 400 nm and shorter than or equal to 500 nm.

As illustrated in (a) of FIG. 1 and FIG. 2, each of the QLEDs (QLEDs 5R, 5G, and 5B) has a configuration in which an anode electrode 22, a hole transport layer (hereinafter referred to as an "HTL") 24a (an HTL 24aR, an HTL 24aG, and an HTL 24aB), each QD light-emitting layer 24b (any one layer of a QD light-emitting layer 24bR, a QD light-emitting layer 24bG, and a QD light-emitting layer 24bB) as a light-emitting layer having a different wavelength region, the ETL 24c (an ETL 24cR, an ETL 24cG, and an ETL 24cB), and a cathode electrode 25 are layered in this order from the array substrate 2 side. The anode electrode 22 is electrically connected to each of the TFTs of the array substrate 2.

The QLED 5R includes the HTL 24aR as the HTL 24a, includes the QD light-emitting layer 24bR as the QD light-emitting layer 24b, and includes the ETL 24cR (first electron transport layer) as the ETL 24c. The QLED 5G includes the HTL 24aG as the HTL 24a, includes the QD light-emitting layer 24bG as the QD light-emitting layer 24b, and includes the ETL 24cG (second electron transport layer) as the ETL 24c. The QLED 5B includes the HTL 24aB as the HTL 24a, includes the QD light-emitting layer 24bB as the QD light-emitting layer 24b, and includes the ETL 24cB (third electron transport layer) as the ETL 24c.

As illustrated in FIG. 2, each of the anode electrode 22, the HTL 24a, the QD light-emitting layer 24b, and the ETL 24c in each subpixel is separated in an island shape for each subpixel by an edge cover 23 that covers an edge of the anode electrode 22. Note that the cathode electrode 25 is not separated by the edge cover 23 and is formed as a common layer common to each subpixel.

The anode electrode 22 and the cathode electrode 25 include a conductive material, and are electrically connected to the HTL 24a and the ETL 24c, respectively. One of the anode electrode 22 and the cathode electrode 25 is a transparent electrode having translucency, and the other is a reflective electrode having light reflectivity. When the display device 1 is a top-emitting display device that extracts light from the cathode electrode 25 side, the cathode electrode 25 is a transparent electrode, and is formed of a transparent conductive material such as indium tin oxide (ITO), indium zinc oxide (IZO), aluminum zinc oxide (AZO), or gallium zinc oxide (GZO), for example. On the other hand, for example, a layered body of a layer formed of the transparent conductive materials and a layer formed of a metal or an alloy thereof having high reflectivity of visible light, such as aluminum (Al), copper (Cu), gold (Au), or silver (Ag) is used for the anode electrode 22. Note that the display device 1 may be a bottom-emitting display device that extracts light from the anode electrode 22 side. In this case, a transparent electrode is used for the anode electrode 22, and a reflective electrode is used for the cathode electrode 25.

The display device 1 recombines positive holes and electrons by a drive current between the anode electrode 22 and the cathode electrode 25 in the QD light-emitting layer 24b, and excitons generated thereby emit light in the process of transitioning from a conduction band level to a valence band level of quantum dots (semiconductor nanoparticles: hereinafter referred to as "QDs").

The HTL 24a transports positive holes from the anode electrode 22 to the QD light-emitting layer 24b. For example, the HTL 24a may include an inorganic material such as nickel oxide (NiO) and molybdenum oxide ($MoO_3$), and may include an organic material such as polyethylene dioxythiophene (PEDOT), poly(3, 4-ethylene dioxythiophene)-poly (styrenesulfonic acid) (PEDOT-PSS), 4,4'-bis [N-phenyl-N-(3"-methylphenyl)amino]biphenyl (TPD), poly(N-vinylcarbazole) (PVK), poly[(9,9-dyoctyl fluorenyl-2,7-diyl)-co-(4,4'-(N-(4-sec-butylphenyl))diphenylamine)] (TFB), 4,4'-bis(9-carbazolyl)-biphenyl (CBP), and N,N'-di-[(1-naphthyl)-N, N'-diphenyl]-(1,1'-biphenyl)-4,4'-diamine (NPD). The HTL 24aR, the HTL 24aG, and the HTL 24aB may be formed of the same material or materials having different hole mobility.

The ETL 24c transports electrons from the cathode electrode 25 to the QD light-emitting layer 24b. Note that the ETL 24c will be described below in detail.

The QD light-emitting layer 24b emits light as a result of recombination between the positive holes transported from the anode electrode 22 and the electrons transported from the cathode electrode 25. In the present embodiment, QDs of each color are provided, as a luminescent material, in each of the subpixels. Specifically, the QD light-emitting layer 24bR in the subpixel RSP includes a red QD, the QD light-emitting layer 24bG in the subpixel GSP includes a green QD, and the QD light-emitting layer 24bB in the subpixel BSP includes a blue QD. In this way, the QD light-emitting layer 24b includes QDs of a plurality of types, and includes QDs of the same type in the same subpixel.

The red QD, the green QD, and the blue QD may include, for example, a semiconductor material formed of an element of at least one type selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg).

The QD light-emitting layer 24b can be formed as a film by separately patterning each of the subpixels using a dispersion, in which the QDs are dispersed in a solvent such as hexane, toluene, octadecane, cyclododecene, and phenylcyclohexane, for example, by a spin coating method, an ink-jet method, or the like. Note that the dispersion described above may be mixed with a dispersion material such as thiol and amine.

The sealing layer 6 prevents penetration of foreign matters such as water and oxygen into the QLED layer 5. The sealing layer 6 includes, for example, an inorganic sealing film 26 that covers the cathode electrode 25, an organic buffer film 27 that is an upper layer overlying the inorganic sealing film 26, and an inorganic sealing film 28 that is an upper layer overlying the organic buffer film 27. Each of the inorganic sealing film 26 and the inorganic sealing film 28 is an inorganic insulating film and can be formed of, for example, a silicon oxide (SiOx) film, a silicon nitride (SiNx) film, a silicon oxynitride (SiNO) film, or a layered film of these, formed by CVD. The organic buffer film 27 is a transparent organic film having a flattening effect and can be formed of a coatable organic material such as an acrylic. The organic buffer film 27 can be formed, for example, by ink-jet application, and a bank for stopping droplets may be provided in a non-display region.

ETL 24c

As illustrated in (b) of FIG. 1, the ETL 24c includes organically modified metal oxide nanoparticles in which a surface of a nanoparticle NP of metal oxide is covered by surface modification with an organic modifier OM having electron donating characteristics. Thus, the ETL 24c includes the nanoparticle NP of the metal oxide and the organic modifier OM that covers the surface of the nanoparticle NP and has electron donating characteristics.

Note that, in the present embodiment, a "nanoparticle" refers to a particle having a weight average particle size of nanometer size (i.e., less than 1 μm). The weight average particle size of the nanoparticle NP described above preferably falls within a range of 1 nm to 20 nm because light-emission characteristics can be improved, and the weight average particle size of the nanoparticle NP more preferably falls within a range of 2.5 nm to 12 nm because electron mobility of the ETL 24c can be improved.

Examples of the metal oxide described above include, for example, metal oxide of at least one type selected from the group consisting of zinc oxide (ZnO), titanium oxide ($TiO_2$), magnesium zinc oxide (MgZnO), tantalum oxide ($Ta_2O_3$), and strontium titanium oxide ($SrTiO_3$). The ETL 24c may include the nanoparticle NP of the metal oxide of the same type in the subpixel RSP, the subpixel GSP, and the subpixel BSP, and may include the nanoparticle NP of the metal oxide of different types for each of the subpixel RSP, the subpixel GSP, and the subpixel BSP. In other words, the ETL 24cR, the ETL 24cG, and the ETL 24cB may include the nanoparticle NP of the metal oxide of the same type, and may include the nanoparticle NP of the metal oxide of types different from each other. As the nanoparticle of the metal oxide used for the ETL, a nanoparticle of zinc oxide (hereinafter referred to as a "ZnO—NP") is common, and is inexpensive and easily available. Thus, the ZnO—NP is preferable as the nanoparticle NP described above.

The organic modifier OM described above is an organic dopant compound capable of giving and receiving electrons, and donating electrons to the nanoparticle NP described above. The nanoparticle NP described above receives electrons from the cathode electrode 25 via the organic modifier OM, and emits (transports) the received electrons to the QD light-emitting layer 24b. The organic modifier OM described above is not particularly limited as long as the organic modifier OM is a dopant (donor) having electron donating characteristics. The dopant is an impurity added to a semiconductor in order to adjust concentration of a carrier (electrons and positive holes) by changing a physical property of a crystal of the semiconductor, and control a band structure such as a forbidden band width, physical characteristics, and the like in various ways. Among dopants, a dopant that supplies electrons as a carrier to a semiconductor is referred to as a donor.

Examples of the organic modifier OM described above include, for example, a compound of at least one type selected from the group consisting of 1,3-bis(carbazole-9-yl)benzene, 4,4', 4"-tri(carbazole-9-yl)triphenylamine, and 4,4'-bis(carbazole-9-yl)biphenyl. The ETL 24cR, the ETL 24cG, and the ETL 24cB may include the organic modifier OM of the same type, and may include the organic modifier OM of types different from each other.

The organic modifiers OM include, for example, a plurality of benzene rings, have a structure in which a nitrogen atom is bonded to the benzene ring, and donate electrons to the nanoparticle NP described above by the electron donating action of unpaired electrons contained in nitrogen.

The organically modified metal oxide nanoparticle described above can be manufactured by applying various known methods known as a method for modifying a surface of an inorganic particle, and a method for manufacturing the organically modified metal oxide nanoparticle is not particularly limited.

When the nanoparticle NP of the metal oxide described above is a ZnO—NP, for example, hexane is added to the ZnO—NP dispersed in ethanol and the ZnO—NP is precipitated to collect the ZnO—NP, and the ZnO—NP and the organic modifier OM described above are caused to coexist by adding a solvent in which the organic modifier OM is dissolved to the ZnO—NP and stirring the mixture, and the like. Thus, surface modification can be performed on the ZnO—NP with the organic modifier OM described above. Note that the surface modification in this case is, for example, chemical bonding by a coordination bond (a coordination bond between a donor and the ZnO—NP by the organic modifier OM), and is performed at normal temperature under atmospheric pressure. However, the surface modification described above may be reactive modification, and temperature, pressure, stirring time, a type of a stirring device, and the like are not particularly limited.

The ETL 24c can be formed by applying the nanoparticle NP of the metal oxide described above and the solvent including the organic modifier OM described above (in other words, dispersion in which the organically modified metal oxide nanoparticle described above is dispersed in the solvent described above) by a spin coating method (spinner coating), an ink-jet method, or the like.

Examples of the solvent described above include, for example, toluene, chlorobenzene, o-dichlorobenzene, phenylcyclohexane, 4-isopropyl biphenyl, 1,1-bis(3,4-dimethylphenyl)ethane, and the like. Only one type of the solvent described above may be used, or a plurality of types may be mixed and used. Since these solvents are volatile, and may volatilize at normal temperature or volatilize by heating, a solid film of the ETL 24c can be easily formed.

According to the present embodiment, by covering the surface of the nanoparticle NP described above with the organic modifier OM, dispersibility of the nanoparticle NP described above in the solvent described above can be improved. Thus, flatness of the ETL 24c is improved by applying the nanoparticle NP described above being covered with the organic modifier OM by, for example, a spin coating method, an ink-jet method, or the like as described above.

Further, when a donor is used for the organic modifier OM, the number of electrons supplied to the QD light-emitting layer 24b can be increased as compared to a case in which the nanoparticle NP described above is not covered with the organic modifier OM (in other words, a case in which the ETL 24c includes only the nanoparticle NP of the metal oxide among the nanoparticle NP of the metal oxide and the organic modifier OM).

The reason is as follows. In a case in which the surface of the nanoparticle NP described above is covered with the organic modifier OM (donor), when electrons are supplied (injected) from the cathode electrode 25 to the nanoparticle NP described above, and the electrons are emitted from the nanoparticle NP described above to the QD light-emitting layer 24b, the electrons are supplied from the donor on the surface of the nanoparticle NP described above to the nanoparticle NP described above. In this way, electrons deficient due to emission are always complemented in the nanoparticle NP described above. Thus, the electrons are never deficient in the QLED. Further, the electrons are also supplied from the cathode electrode 25 to the donor. When the electrons are supplied from the cathode electrode 25 to the donor, the electrons are supplied from the donor to the nanoparticle NP described above so as to be extruded, and the electrons are further emitted from the nanoparticle NP described above to the QD light-emitting layer 24b so as to be extruded. Thus, electron exchange is performed via the donor in such a manner, and thus mobility (movement speed) of the electrons is increased. The amount (number) of electrons flowing per unit time increases with a faster movement speed. Therefore, the number of electrons supplied to the QD light-emitting layer 24b can be increased by the nanoparticle NP described above being covered with the organic modifier OM. In this way, in the present embodiment, the number of electrons supplied to the QD light-emitting layer 24b can be increased by the nanoparticle NP described above being covered with the organic modifier OM having electron donating characteristics. Thus, luminous efficiency of the display device 1 can be improved further than that in the related art.

Further, it is preferable that the number of positive holes and the number of electrons in the QD light-emitting layer 24b match as much as possible. The number of positive holes and the number of electrons in the QD light-emitting layer 24b match, and thus luminous efficiency improves. Particularly, in recent years, development of a material having high positive hole transport efficiency as an HTL material has been advanced. According to the present embodiment, even when a material having high hole transport efficiency is used for the HTL 24a, electrons are never deficient in the QLED. Thus, in the present embodiment, luminous efficiency can be easily improved. Further, by adjusting a state to a state where electrons are neither too much nor too little by covering the surface of the nanoparticle NP described above with a donor and supplying the electrons from the donor to the nanoparticle NP described above, the number of positive holes and the number of electrons in the QD light-emitting layer 24b can also be adjusted so as to substantially match. Thus, in the present embodiment, luminous efficiency can also be easily improved.

Figure 3:
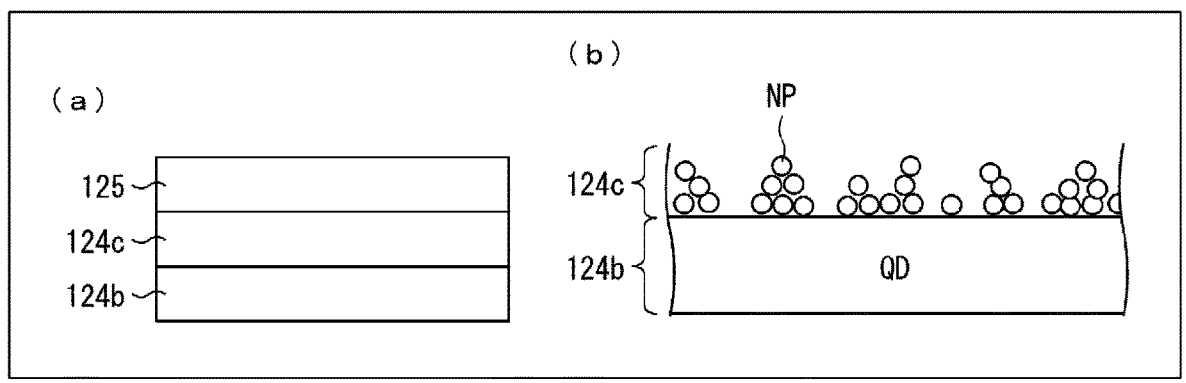
FIG. 3(a) is a diagram illustrating a layered structure of main portions of a light-emitting element of a known display device.
FIG. 3(b) is a diagram schematically illustrating a structure of an electron transport layer on a light-emitting layer of the display device illustrated in FIG. 3(a).

Further, in a known light-emitting element, since a surface of the nanoparticle NP is not covered with a modifier (donor) and the surface of the nanoparticle NP is uncovered, the nanoparticle NP itself is subjected to thermal damage when a material that becomes an upper layer of the ETL 124c is applied onto the ETL 124c as illustrated in (b) of FIG. 3, for example. Further, since the surface of the nanoparticle NP is uncovered, damage (degradation) of the nanoparticle NP caused by foreign matters such as oxygen and water under an active atmosphere (i.e., under an atmosphere where the foreign matters are present) is great, and electrochemical characteristics quickly decrease.

However, according to the present embodiment, by covering the surface of the nanoparticle NP described above with the organic modifier OM as described above, the nanoparticle NP described above is less susceptible to damage (degradation) due to the foreign matters described above such as water and oxygen under an active atmosphere. Thus, according to the present embodiment, the display device 1 having higher reliability than in the related art can be provided.

Further, as described above, since the surface of the nanoparticle NP is not covered with the modifier (donor) in the known light-emitting element, the nanoparticles NP are easily agglomerated and have low dispersibility. Thus, in the known light-emitting element, an interval between the nanoparticles NP increases depending on an application state of the dispersion, and thus a barrier effect is low. In a case in which the ETL 124c is non-uniform as illustrated in (b) of FIG. 3, when a material that becomes an upper layer of the ETL 124c is applied onto the ETL 124c (for example, when the cathode electrode 125 is layered by a technique such as sputtering or vapor deposition), there is a possibility that a lower layer of the ETL 124c such as the quantum dot light-emitting layer 124b may be subjected to thermal damage.

However, according to the present embodiment, by covering the surface of the nanoparticle NP described above with the organic modifier OM as described above, the organic modifier OM described above can reduce thermal damage to the nanoparticle NP described above itself and thermal damage to the lower layer of the ETL 24c such as the QD light-emitting layer 24b due to heat when the material that becomes the upper layer of the ETL 24c is applied onto the ETL 24c (for example, when the cathode electrode 25 is layered by a technique such as sputtering or vapor deposition). Particularly, according to the present embodiment, as described above, by covering the surface of the nanoparticle NP described above with the organic modifier OM, the ETL 24c having high flatness can be formed. Therefore, the lower layer of the ETL 24c is not damaged through a portion where the ETL 24c is thinner than others. Thus, according to the present embodiment, damage to the lower layer of the ETL 24c caused by the ETL 24c having a non-uniform film thickness can be prevented.

As described above, according to the present embodiment, the display device 1 having higher dispersibility of the electron transport layer including the nanoparticles of the metal oxide than that in the related art and having more excellent luminous efficiency than that in the related art can be provided. Further, according to the present embodiment, as described above, the display device 1 capable of improving flatness of the electron transport layer including the nanoparticles of the metal oxide further than that in the related art and also capable of protecting the nanoparticles described above from heat and foreign matters such as oxygen and water can be provided.

In the present embodiment, a volume ratio (combination ratio) of the organic modifier OM to the nanoparticle NP described above in the ETL 24c, which is indicated by the organic modifier OM/the nanoparticle NP of the metal oxide, preferably falls within a range of 1/99 to 30/70, more preferably falls within a range of 2/98 to 20/80, and particularly preferably falls within a range of 10/90 to 20/80. Note that the volume ratio described above can be easily determined by determining each diameter of the nanoparticle NP and the organic modifier OM by, for example, a scanning electron microscope (SEM).

Table 1 shows a relationship among a volume ratio between the nanoparticle NP described above and a donor, a film thickness (average film thickness) of the ETL, film thickness controllability of the ETL, surface roughness of the ETL, and external quantum efficiency (EQE) of the display device when the display device having the structure illustrated in FIG. 2 is manufactured in the same condition, except that the volume ratio described above is changed in various ways, where a ZnO—NP is used as the nanoparticle NP described above, 1,3-bis(carbazole-9-yl)benzene is used as the organic modifier OM (donor), and toluene is used as a solvent. Note that, in Table 1, Sample No. 1 is a comparative product, and Sample No. 2 to 8 is a product of the present embodiment.

Note that, in Table 1, the film thickness controllability indicates a difference between an actually formed film thickness of the ETL and an intended film thickness (target film thickness: 60 nm) measured by a step gauge. When the difference between the formed film thickness of the ETL and the target film thickness falls within a range of less than or equal to ±1.0 nm, "excellent" is indicated. When the difference described above falls within a range of greater than ±1.0 nm and less than or equal to ±5.0 nm, "good" is indicated. When the difference described above falls within a range of greater than ±5.0 nm and less than or equal to ±8.0 nm, "marginal" is indicated.

Further, in Table 1, the surface roughness (Rms) indicates magnitude of surface roughness of the ETL measured by an atomic force microscope (AFM). When the surface roughness described above is less than 3.0 nm, "excellent" is indicated. When the surface roughness described above is greater than or equal to 3.0 nm and less than or equal to 3.5 nm, "good" is indicated. When the surface roughness described above is greater than 3.5 nm and less than or equal to 4.0 nm, "marginal" is indicated.

TABLE 1

| SAMPLE No. | VOLUME RATIO IN ELT (%) | | FILM THICKNESS (nm) | FILM THICKNESS CONTROLLABILITY | SURFACE ROUGHNESS | EQE |
|---|---|---|---|---|---|---|
| | ZnO-NP | DONOR | | | | |
| 1 (COMPARATIVE EXAMPLE) | 100 | — | 64.4 | GOOD | MARGINAL | 5.2% (51.0 mA/cm$^2$) |
| 2 (EXAMPLE 1) | 99 | 1 | 63.9 | GOOD | GOOD | 5.4% (48.6 mA/cm$^2$) |

TABLE 1-continued

| SAMPLE No. | VOLUME RATIO IN ELT (%) | | FILM THICKNESS (nm) | FILM THICKNESS CONTROLLABILITY | SURFACE ROUGHNESS | EQE |
|---|---|---|---|---|---|---|
| | ZnO-NP | DONOR | | | | |
| 3 (EXAMPLE 2) | 98 | 2 | 62.1 | GOOD | GOOD | 6.2% (40.2 mA/cm$^2$) |
| 4 (EXAMPLE 3) | 90 | 10 | 60.1 | EXCELLENT | EXCELLENT | 6.7% (38.6 mA/cm$^2$) |
| 5 (EXAMPLE 4) | 80 | 20 | 60.2 | EXCELLENT | EXCELLENT | 7.2% (30.1 mA/cm$^2$) |
| 6 (EXAMPLE 5) | 70 | 30 | 62.4 | GOOD | EXCELLENT | 5.8% (44.2 mA/cm$^2$) |
| 7 (EXAMPLE 6) | 60 | 40 | 66.1 | MARGINAL | EXCELLENT | 5.6% (47.1 mA/cm$^2$) |
| 8 (EXAMPLE 7) | 50 | 50 | 66.2 | MARGINAL | EXCELLENT | 5.4% (49.0 mA/cm$^2$) |

As shown in Table 1, since the products of the present embodiment include the nanoparticle NP described above and the organic modifier OM having electron donating characteristics unlike the comparative product, it was demonstrated that the products of the present embodiment improve the EQE further than that of the comparative product described above.

Further, as shown in Table 1, it was confirmed that, by setting the volume ratio of the donor to the nanoparticle NP described above in the ETL 24c to be 1/99 to 30/70, the EQE can be improved further than that in the related art, and excellent film thickness controllability can also be obtained. Further, it was confirmed that, by setting the volume ratio described above to fall within a range of 10/90 to 20/80, dispersibility of the organically modified metal oxide nanoparticles described above (i.e., the nanoparticles NP of the metal oxide covered with the donor described above) can be improved, and film thickness controllability can be enhanced, and the ETL 24c having a film thickness that is not greatly different from the intended film thickness (target film thickness: 60 nm) can also be formed because the surface roughness is small.

Note that, as in a case in which the volume ratio described above is 40/40, 50/50, or the like, when the donor component for the nanoparticles described above is increased, a film thickness of the ETL 24c becomes slightly thicker than the target film thickness described above, and the film thickness controllability is low, but it is highly likely that the film thickness is closer to the target film thickness by solution adjustment.

In other words, in order to evaluate the volume ratio described above, the measurement described above was performed such that the ETL 24c is film-formed in the same condition except that a volume ratio between the nanoparticle NP and the donor is changed in various ways as described above. When the donor component for the nanoparticles described above is great, the film thickness controllability is lower than that when the amount of the donor component for the nanoparticles is small. However, even when the amount of the donor component for the nanoparticles described above is great as described above, a film thickness of the ETL 24c can be set closer to the target film thickness described above by changing a film formation condition.

Further, as shown in Table 1, according to the present embodiment, in all the samples being the products of the present embodiment, a flatter ETL having lower surface roughness was acquired as compared to the comparative product of Sample No. 1.

In any case, according to the present embodiment, by covering the surface of the nanoparticle NP described above with the organic modifier OM, as described above, dispersibility of the nanoparticle NP described above in the solvent described above can be improved further than that in the related art, and the ETL 24c having higher flatness than the related art, capable of achieving uniform light emission, and having high luminous efficiency can be formed. Further, in any case, according to the present embodiment, by covering the nanoparticle NP described above with the organic modifier OM (donor), as described above, the number of electrons supplied to the QD light-emitting layer 24b can be increased, and damage to the nanoparticle NP described above due to foreign matters under an active atmosphere and damage to the nanoparticle NP described above and the lower layer of the ETL 24c due to heat during formation of the cathode electrode 25 can also be prevented.

Further, in the present embodiment, as described above, the ETL 24c is formed in an island shape by separately patterning for each subpixel. From a perspective of luminous efficiency, the volume ratio of the organic modifier OM described above to the nanoparticle NP described above is preferably greater in the order of the ETL 24cB (third electron transport layer), the ETL 24cG (second electron transport layer), and the ETL 24cR (first electron transport layer). In this case, the volume ratio of the organic modifier OM described above to the nanoparticle NP described above in the ETL 24cB preferably falls within a range of 2/98 to 10/90, the volume ratio of the organic modifier OM described above to the nanoparticle NP described above in the ETL 24cG preferably falls within a range of 10/90 to 20/80, and the volume ratio of the organic modifier OM described above to the nanoparticle NP described above in the ETL 24cR preferably falls within a range of 20/80 to 30/70 (note that the volume ratio described above satisfies a relationship of ETL 24cR>ETL 24cG>ETL 24cB). By setting the volume ratio described above so as to satisfy the relationship described above and fall within the range described above, luminous efficiency can be controlled.

Method for Manufacturing Display Device 1

Next, a method for manufacturing the display device 1 described above will be described. Note that, hereinafter, a case in which a flexible display device is manufactured as the display device 1 will be described as an example.

When the flexible display device 1 is manufactured, first, the resin layer 12 is formed on a transparent support substrate (a mother glass, for example) (not illustrated). Next, as illustrated in FIG. 2, the barrier layer 3, the TFT layer 4, the QLED layer 5, and the sealing layer 6 are formed on the resin layer 12 in this order. Subsequently, an upper face film is bonded onto the sealing layer 6. Next, after the support substrate is peeled from the resin layer 12 by irradiation with laser light or the like and the lower face film 10 is bonded to the lower face of the resin layer 12, a layered body including the lower face film 10, the resin layer 12, the barrier layer 3, the TFT layer 4, the QLED layer 5, and the sealing layer 6 is divided to obtain a plurality of individual pieces. Next, a function film (not illustrated) is bonded to the obtained individual pieces. Subsequently, an electronic circuit board (for example, an IC chip or an FPC) is mounted on a portion (terminal portion) located outward (a non-display region, frame) from a display region where a plurality of subpixels are formed. In this way, the display device 1 is manufactured.

In a step of forming the QLED layer 5, for example, the anode electrode 22, the edge cover 23, the HTL 24a, the QD light-emitting layer 24b, the ETL 24c, and the cathode electrode 25 are formed in this order on the TFT layer 4.

In a step of forming the ETL 24c described above, as described above, a solvent in which the organic modifier OM (donor) is dissolved is added to the nanoparticle NP of the metal oxide, and the like, for example, to prepare a dispersion including the nanoparticle NP of the metal oxide being subjected to surface modification with the organic modifier OM, and the dispersion is applied onto the QD light-emitting layer 24b by a spin coating method, an ink-jet method, or the like, for example.

At this time, in the present embodiment, after the QD light-emitting layer 24b (any one layer of the QD light-emitting layer 24bR, the QD light-emitting layer 24bG, and the QD light-emitting layer 24bB) is cured in each subpixel, a corresponding ETL 24c (the ETL 24cR, the ETL 24cG, and the ETL 24cB) is layered on each QD light-emitting layer 24b. In this way, the material of the QD light-emitting layer 24b and the material of the ETL 24c are not mixed with each other.

Note that, by using an ink-jet method for applying the dispersion described above, application can be performed in a narrow range with higher precision than a spin coating method, for example. Thus, the ETL 24c of high quality in terms of a film thickness and the like can be formed.

Further, in the present embodiment, the ETL 24c is formed at 150° C. or lower. In this way, the material of the QD light-emitting layer 24b is not subjected to thermal damage.

Modification Example

Further, in the present embodiment described above, a case in which a light-emitting element is a QLED is described as an example, but the present embodiment is not limited thereto. The light-emitting element described above may be, for example, an organic light emitting diode (OLED) or an inorganic light emitting diode.

Further, in the present embodiment, a case in which quantum dots of a plurality of types are a combination of a red QD, a green QD, and a blue QD, and the display device 1 includes the subpixel RSP, the subpixel GSP, and the subpixel BSP as a subpixel is described as an example, but this combination may not necessarily be used.

Further, in the present embodiment, a case in which the light-emitting element includes, as a function layer, the HTL 24a, the light-emitting layer (for example, the QD light-emitting layer 24b), and the ETL 24c layered in this order from the anode electrode 22 side between the anode electrode 22 and the cathode electrode 25 is described as an example. However, the embodiment is not limited to the combination described above as long as the function layer described above includes the light-emitting layer, and also includes the ETL 24c between the cathode electrode 25 and the light-emitting layer. For example, the light-emitting element may further include a function layer other than the function layer described above between the cathode electrode 25 and the ETL 24c, such as an electron injection layer (EIL).

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

The invention claimed is:

1. A display device, comprising:
   an anode electrode;
   a cathode electrode;
   a light-emitting layer provided between the anode electrode and the cathode electrode;
   an electron transport layer provided between the cathode electrode and the light-emitting layer;
   a red subpixel;
   a green subpixel; and
   a blue subpixel,
   wherein the electron transport layer includes a nanoparticle of a metal oxide, and an organic modifier configured to cover a surface of the nanoparticle and having electron donating characteristics,
   the electron transport layer includes a first electron transport layer formed in the red subpixel, a second electron transport layer formed in the green subpixel, and a third electron transport layer formed in the blue subpixel, and
   a volume ratio of the organic modifier to the nanoparticle is greater in order of the third electron transport layer, the second electron transport layer, and the first electron transport layer.

2. The display device according to claim 1,
   wherein the organic modifier is a compound of at least one type selected from the group consisting of 1,3-bis(carbazole-9-yl)benzene, 4,4',4"-tri(carbazole-9-yl)triphenylamine, and 4,4'-bis(carbazole-9-yl)biphenyl.

3. The display device according to claim 1,
   wherein a volume ratio of the organic modifier to the nanoparticle falls within a range of 1/99 to 30/70.

4. The display device according to claim 1,
   wherein a volume ratio of the organic modifier to the nanoparticle in the first electron transport layer falls within a range of 20/80 to 30/70,
   a volume ratio of the organic modifier to the nanoparticle in the second electron transport layer falls within a range of 10/90 to 20/80, and
   a volume ratio of the organic modifier to the nanoparticle in the third electron transport layer falls within a range of 2/98 to 10/90.

5. The display device according to claim 1,
   wherein the metal oxide is at least one type selected from the group consisting of zinc oxide, titanium oxide, magnesium zinc oxide, tantalum oxide, and strontium titanium oxide.

* * * * *